United States Patent
Tsuchiaki (10) Patent No.: US 6,683,356 B2
(45) Date of Patent: Jan. 27, 2004

(54) SEMICONDUCTOR DEVICE WITH OXYGEN DOPED REGIONS

(75) Inventor: Masakatsu Tsuchiaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/159,118

(22) Filed: Jun. 3, 2002

(65) Prior Publication Data
US 2002/0182831 A1 Dec. 5, 2002

(30) Foreign Application Priority Data
Jun. 4, 2001 (JP) .......................... 2001-168760

(51) Int. Cl.⁷ ............................................... H01L 29/76
(52) U.S. Cl. ..................... 257/412; 257/382; 257/383; 257/408; 438/682; 438/683; 438/686
(58) Field of Search .................... 257/344, 382, 257/383, 408, 412; 438/682, 683, 686

(56) References Cited

U.S. PATENT DOCUMENTS

| | | | | |
|---|---|---|---|---|
| 3,739,237 A | * | 6/1973 | Shannon | 257/387 |
| 5,169,796 A | * | 12/1992 | Murray et al. | 438/232 |
| 6,475,868 B1 | * | 11/2002 | Hao et al. | 438/301 |
| 2003/0062575 A1 | * | 4/2003 | Tsuchiaki | 257/382 |

FOREIGN PATENT DOCUMENTS

| | | |
|---|---|---|
| JP | 1-47004 | 10/1989 |
| JP | 2698585 | 9/1997 |

OTHER PUBLICATIONS

Masakatsu Tsuchiaki, et al., "Intrinsic Junction Leakage by Co In-Diffusion During CoSi$_2$ Formation Characterized with Damage Free n+/p Silicon Diodes", Extended Abstracts of the 2001 International Conference on Solid State Devices and Materials, Tokyo, Sep. 27, 2001, pp. 216–217.

* cited by examiner

Primary Examiner—Richard Elms
Assistant Examiner—Christian D. Wilson
(74) Attorney, Agent, or Firm—Oblon, Spivak, McClelland, Maier & Neustadt, P.C.

(57) ABSTRACT

A semiconductor device includes sidewall insulating films formed on sides of the gate electrode layer respectively facing source and drain regions, and silicide layers formed on the source and drain regions. Oxygen-introduced portions are respectively formed in the source and drain regions near the sidewall insulating films. The oxygen-introduced portions contain oxygen atoms that are locally distributed on the interfaces between the silicide layers and the silicon layers of the source or drain regions at a concentration of $4.5 \times 10^{19}$ cm$^{-3}$ or more and an areal density of $5 \times 10^{13}$ cm$^{-2}$ or more. The oxygen-introduced portions form an Ohmic contact between the silicide layers and the silicon layers of the source or drain regions.

20 Claims, 6 Drawing Sheets

SEMICONDUCTOR DEVICE WITH OXYGEN DOPED REGIONS

CROSS-REFERENCE TO RELATED APPLICATIONS

This application is based upon and claims the benefit of priority from the prior Japanese Patent Application No. 2001-168760, filed Jun. 4, 2001, the entire contents of which are incorporated herein by reference.

BACKGROUND OF THE INVENTION

1. Field of the Invention

The present invention relates to a semiconductor device such as a field effect transistor (to be referred to as a MOSFET hereinafter) and a method of manufacturing the same and, more particularly, a semiconductor device having a silicide layer on source and drain regions and a method of manufacturing the same.

2. Description of the Related Art

In micropatterning a MOSFET serving as a main component of a semiconductor device, a so-called short channel effect, i.e., a drop of a threshold voltage along with reduction of the channel length (i.e., the length of a gate electrode layer), poses a serious problem. This short channel effect can be avoided by forming a shallow pn junction at the bottom of source and drain regions. However, if a pn junction is simply made shallow, the resistance of source and drain regions formed by the pn junction increases and impedes high-speed transmission of a signal through the device.

Recently, to decrease the resistance of a source and drain, the upper portions of source and drain regions are partially combined with a metal (silicidated). As a metal species for silicidation, an element such as Co, Ti, or Ni is used. Of these elements, only Co is free from an adverse narrow-line effect (i.e., Co shows no undesirable increase in electrical resistance when silicide is formed on a narrow silicon line) while maintaining thermal stability at high temperature (i.e., retaining compatibility with LSI manufacturing process).

However, when a silicide layer is formed on shallow source and drain regions, leakage readily occurs at the pn junction on the bottom of the source and drain regions.

BRIEF SUMMARY OF THE INVENTION

According to a first aspect of the present invention, there is provided a semiconductor device comprising:

a pair of source and drain regions each formed in a surface portion of a silicon layer, and spaced from each other through a channel region in a surface portion of a silicon layer in a channel length direction;

a gate electrode layer formed on the channel region via an insulating film;

a pair of sidewall insulating films formed on sides of the gate electrode layer respectively facing the source and drain regions;

a pair of silicide layers respectively formed on the source and drain regions, and extending from the sidewall insulating films toward outer ends of the source and drain regions; and a pair of oxygen-introduced portions respectively formed in the source and drain regions, and extending under the silicide layers from the sidewall insulating films toward the outer ends of the source and drain regions, the oxygen-introduced portions containing oxygen atoms that are locally distributed on interfaces between the silicide layers and the silicon layers of the source or drain regions at a concentration of not less than $4.5 \times 10^{19}$ cm$^{-3}$ and an areal density of not less than $5 \times 10^{13}$ cm$^{-2}$ and, and the oxygen-introduced portions forming an Ohmic contact between the silicide layers and the silicon layers of the source or drain regions.

According to a second aspect of the present invention, there is provided a method of manufacturing the semiconductor device of the first aspect, comprising:

forming the source and drain regions, using impurity ion implantation and annealing;

implanting predetermined ions to positions of the source and drain regions, which correspond to the oxygen-introduced portions, through an oxide film so as to introduce oxygen atoms in the oxide film into the source and drain regions;

depositing a metal film on the source and drain regions; and forming the silicide layer by siliciding the metal film, using annealing.

DETAILED DESCRIPTION OF THE INVENTION

In the process of development of the present invention, the present inventors studied reasons why leakage readily occurs at the pn junction on the bottom of shallow source and drain regions when a silicide layer is formed on the source and drain regions, and measures against it. Consequently, the present inventors obtained the following findings.

When diffusion layers in source and drain regions are silicided, metal atoms rapidly diffuse into the silicon of the source and drain regions. Diffusion of metal atoms is very fast. Co atoms reach a depth of 150 nm only by rapid annealing at 800° C. for 30 sec for silicidation. This causes junction leakage.

Figure 7:
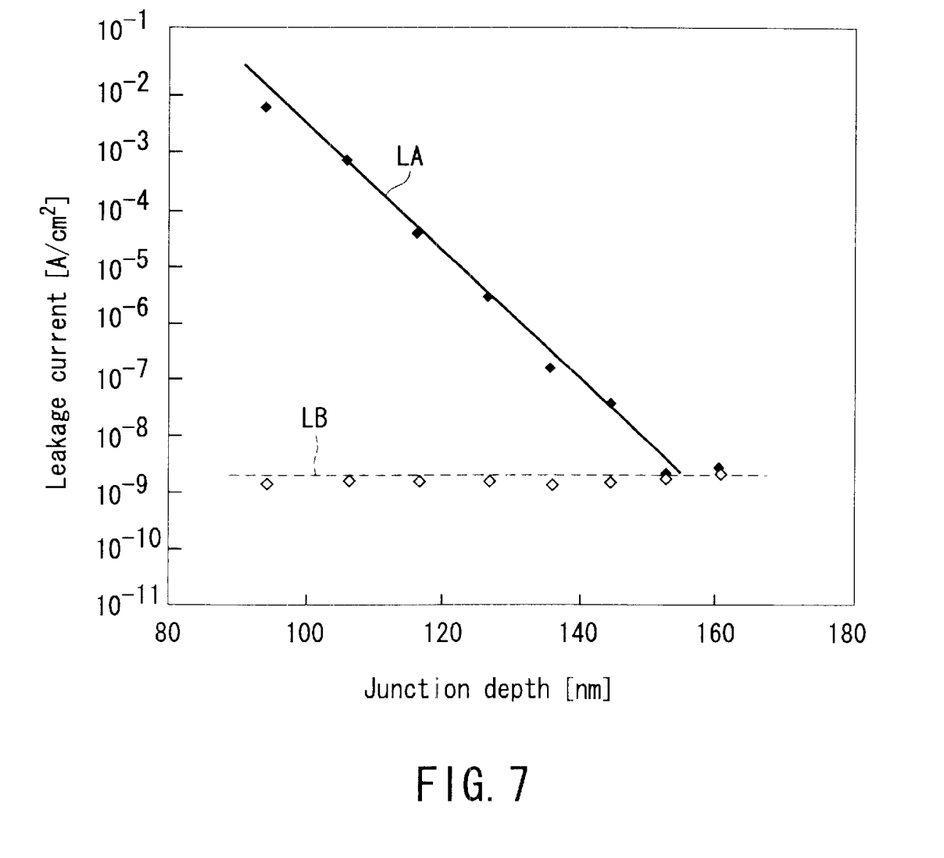
FIG. 7 is a graph showing junction leakage generation due to Co diffusion into a silicon substrate, as a function of junction depth.

FIG. 7 is a graph showing occurrence of junction leakage due to Co diffusion into a silicon substrate during a silicidation process, as a function of junction depth. Referring to FIG. 7, a line LA indicates junction leakage values when 35-nm $CoSi_2$ layers are formed on $n^+/p$ junctions with different junction depths. A line LB indicates control data when no silicidation is executed. In either case, the reverse bias voltage applied is 4 V. As is apparent from the line LA, when a silicide layer is formed, junction leakage occurs even at a junction depth of 150 nm much deeper than the silicide layer. This is because Co atoms diffuse into the substrate. When a current leaks through the junction due to deeply diffused metal atoms, device operation is damaged. In a memory device such as a DRAM, written information is lost. That is, a semiconductor device loses its original function.

To cope with this problem, a method (elevated source drain method) has been proposed, in which a semiconductor material is selectively added on the surface of a semiconductor substrate where source and drain regions should be formed. In this method, the surfaces of source and drain regions are shifted above the original semiconductor surface (i.e., a surface in which a channel is to be formed). Formation process of silicide layers and pn junctions of the source and drain regions are then applied on these raised surfaces. Thus-formed junction of the source and drain regions are located shallower with respect to the original semiconductor surface while maintaining deeper position with respect to the newly formed surfaces. Hence, the depth of diffusion layers of the source and drain regions (i.e., thickness of the source and drain electrodes) is secured.

Such selective silicon growth can be achieved using epitaxial growth. In this method, however, the position of the pn junction of source and drain regions that should be finally formed must be accurately adjusted to the original semiconductor surface (i.e., a surface in which a channel is to be formed) or to be slightly lower than it. This is because if the junction portion is located above this surface (channel surface), the current drivability of this MOSFET greatly degrades. In addition, when the junction is formed to be much lower than the surface, a short channel effect occurs.

However, the epitaxial growth is very sensitive to the state of the substrate surface on which the selective silicon growth is to be achieved. For instance, the thickness of the silicon film grown on the substrate varies depending on the roughness or crystalline structure of the substrate surface. Also, the quality of the grown film (i.e., the presence/absence of the crystalline defects in the film) depends on the surface condition of the substrate. Thus, for example, incomplete removal of a native oxide on the substrate surface or residual process-damage incurred during gate electrode formation may well result in severe variation in the film thickness between individual devices for which elevation of source and drain regions is attempted.

If the thickness of an additionally formed silicon layer is nonuniform, it is very difficult to form a pn junction near the original semiconductor substrate surface (i.e., a surface in which a channel is to be formed). The reason for this is as follows. A carrier impurity to form source and drain regions is introduced from an additionally formed silicon surface. Hence, a junction is formed at a predetermined position from the surface. However, if the film thickness is nonuniform, the relative position of the original semiconductor surface (i.e., a surface in which a channel is to be formed) from the additionally formed silicon surface is indefinite. Hence, the position at which a junction interface is to be formed is also indefinite.

Likewise, if the quality of the grown silicon films differs from a device to a device, it becomes difficult to place the pn junctions precisely at the targeted position near the original semiconductor surface. This is because, the presence of crystal defects in the film (i.e., the film quality) greatly influences the speed of impurity diffusion in the film (e.g., transient enhance diffusion). It entails that the predetermined thermal diffusion of the impurity for the junction formation could result in non-uniform junction depth due to unexpected impurity diffusion caused by the crystal defects in the film.

Similarly, the diffusion of metal atoms during silicidation is also subject to the quality of the grown silicon films. Thus, even when the source and drain regions are raised by the additional silicon films, if their thicknesses and quality are non-uniform, metal atoms can easily diffuse and penetrate the junctions at points where the film thickness is thin or the film quality is low. It follows that the non-uniformity of the film thickness and quality limits the effectiveness of the epitaxial growth to counter the leakage generation by the silicidation process.

Furthermore, the metal diffusion in a silicon crystal is very fast itself. Accordingly, in order to block the metal diffusion effectively, the additional silicon layer must be very thick (i.e., thicker than 150 nm). However, due to above-describe reasons, it is almost impossible to selectively and uniformly grow silicon layers as thick as 150 nm on the individual source and drain regions. Moreover, the height of the source and drain regions, raised by 150 nm, almost equals the height of the gate electrodes. The lack of the height-difference makes it difficult to ensure electrical isolation between gate electrodes and source/drain regions when silicidation process is applied to these electrode and regions simultaneously (SALICIDE process).

In addition, a selectively grown silicon film tends to become thinner in a region adjacent to a gate electrode (which is an intrinsic characteristic of the epitaxial growth). Prior to the silicidation process, the shortest distance between a metal film deposited on the device surface and the source/drain junction is determined at this portion. Hence it is this thinner region that could eventually limit the film's ability to block the metal diffusion regardless of the thickness of the additional silicon films grown elsewhere.

As described above, in manufacturing of a small-dimension MOSFET device, a silicide layer must be formed on source and drain regions to secure low electrical resistance of the regions while keeping a shallow junction position of the source and drain regions. However, fast metal diffusion during the silicide reaction easily penetrates the shallow junctions and induces leakage. To counter the leakage generation, source and drain regions could be elevated by selective epitaxial growth. Even with this elevation, the fast metal diffusion requires that a silicon layer must be selectively grown to a thickness almost equal to the height of a gate electrode. Unfortunately, however, it is very difficult to form such a thick film having a uniform thickness and quality with this method.

An embodiment of the present invention based on the above findings will be described below with reference to the accompanying drawing. The same reference numerals denote components having substantially the same functions and arrangements in the following description, and a repetitive description will be made as needed.

Figure 1:
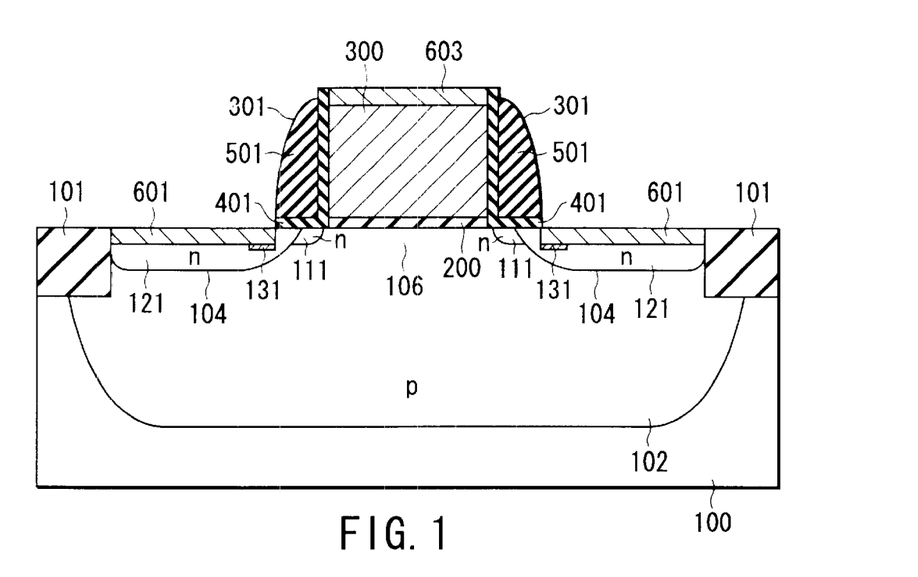
FIG. 1 is a sectional view showing a semiconductor device having an N-MOSFET structure according to an embodiment of the present invention.

FIG. 1 is a sectional view showing a semiconductor device having an N-MOSFET structure according to an embodiment of the present invention. A plurality of device-isolation regions 101 are formed in the surface of a silicon substrate 100. A p-well 102 with a carrier impurity (B) concentration of about $1\times10^{18}$ cm$^{-3}$ is formed in the surface of the silicon substrate 100 between two device-isolation regions 101. A pair of n-source and n-drain regions 104 are separately formed in the well 102. Each of the source and drain regions 104 has a carrier impurity (As) surface concentration of $5\times10^{20}$ cm$^{-3}$ or more, and formed of a shallow diffusion layer (extension) 111 and a deep diffusion layer 121.

A surface region of the well 102 sandwiched between the pair of source and drain regions 104 in the channel direction is defined as a channel region 106. A polysilicon gate electrode layer 300 is formed on the channel region 106 via a gate insulating film 200. An n-inverted layer that connects the pair of source and drain regions 104 is selectively induced in the surface of the channel region 106 by the gate electrode layer 300.

A pair of sidewall insulating films 301 are formed on the sides of the gate electrode layer 300 respectively facing the source and drain regions 104. Each sidewall insulating film 301 is formed from a silicon oxide film 401 on the silicon substrate 100 and gate electrode layer 300 and a silicon nitride film 501 on the silicon oxide film 401. The silicon oxide film 401 has a thickness of from 5 to 30 nm, and preferably, a thickness of from 10 to 20 nm.

Silicide layers 601 and 603 are formed on the source and drain regions 104 and gate electrode layer 300, respectively. Each of the silicide layers 601 and 603 is made of a CoSi$_2$ layer. The distance from the bottom of the silicide layer 601 to the bottom of the source or drain region is set to be 100 nm or less.

An oxygen-introduced portion is formed near the surface area of each source and drain region immediately outside of the sidewall. In the channel length direction, each oxygen-introduced portion is adjacent to the sidewall and formed to have a length of 10 nm or more and ½ or less the length of the corresponding source or drain region outside of the sidewall. For example, assume that the source or drain region extends 100 nm outside of the sidewall along the channel direction, the oxygen-introduced portion has a length of 50 nm or less, and preferably 35 nm or less in this direction.

In the oxygen-introduced portion 131, oxygen atoms are locally distributed on the interface between the silicide layer 601 and the silicon layer of the source or drain region 104 at a concentration of $4.5\times10^{19}$ cm$^{-3}$ or more and an areal density of $5\times10^{13}$ cm$^{-2}$ or more. However, the oxygen-introduced portion 131 is not a silicon oxide film. Instead, the oxygen-introduced portion 131 forms an Ohmic contact with the silicide layer 601 and the silicon layer of the source or drain region 104. This Ohmic contact has a contact resistance of $1\times10^{-6}$ $\Omega$cm$^{-2}$ or less. Additionally, the oxygen-introduced portion 131 contains As at a higher concentration approximately by $4\times10^{19}$ to $4\times10^{20}$ cm$^{-3}$, than the other portion of the source and drain region 104, because of the specific manufacturing method used (to be described later).

The oxygen-introduced portions 131 can be formed by, before metal films to be silicided are deposited on the source and drain regions 104, implanting predetermined ions (preferably As) through an oxide film and introducing "knock-on" oxygen into the source and drain regions. The knock-on oxygen prevents metal atoms from diffusing to the pn-junction at the expense of a certain increase in the contact resistance formed between the silicide layers and underlying silicon regions. Nonetheless, implantation through an oxide reduces the junction leakage very effectively while maintaining shallow source/drain junctions.

An effective implementation of the implantation-through-an-oxide method can be obtained through the following consideration. First, the most vulnerable points to the junction leakage are source and drain regions adjacent to the sidewall (i.e., near the source/drain extension). Because the depth of the source/drain extension is shallower than the remaining source/drain region, source/drain junctions near the sidewall are formed only by lateral diffusion of the source/drain impurity. It means that the junction depth around these regions is the shallowest among the portions on which the silicide layers are formed. Therefore, these regions are the primary areas to be protected against the leakage generation by silicidation. Here, utilizing implantation through the silicon oxide film 401, it is able to introduce knock-on oxygen exactly into these critical regions. The introduction is achieved in a self-aligned manner (as explained later in more detail). The knock-on oxygen prevents metal diffusion during silicidation and effectively suppresses leakage generation.

Although ion implantation can be executed only for portions corresponding to the oxygen-introduced portions 131, it may be done for the entire source and drain regions 104. Where the surfaces of the source and drain regions 104 are converted into an amorphous by the ion implantation, the reaction in the next silicidation process is modulated, and diffusion of the siliciding metal into the silicon substrate is suppressed.

The mechanism of this phenomenon will be described below in more detail.

Immediately before a siliciding metal is deposited, a substance such as As is ion-implanted through an oxide film. By doing so, the surfaces of the source and drain regions are provided with crystal defects and "knock-on" oxygen, which is generated when the implanted ions have knocked out oxygen in the oxide film. The crystal defects modulate the reaction in the subsequent silicidation process and suppress the siliciding metal from diffusing to the silicon substrate. Moreover, it is found that, when both crystal defects and the knock-on oxygen are present, diffusion of the metal atoms is suppressed much more efficiently.

Figure 2:
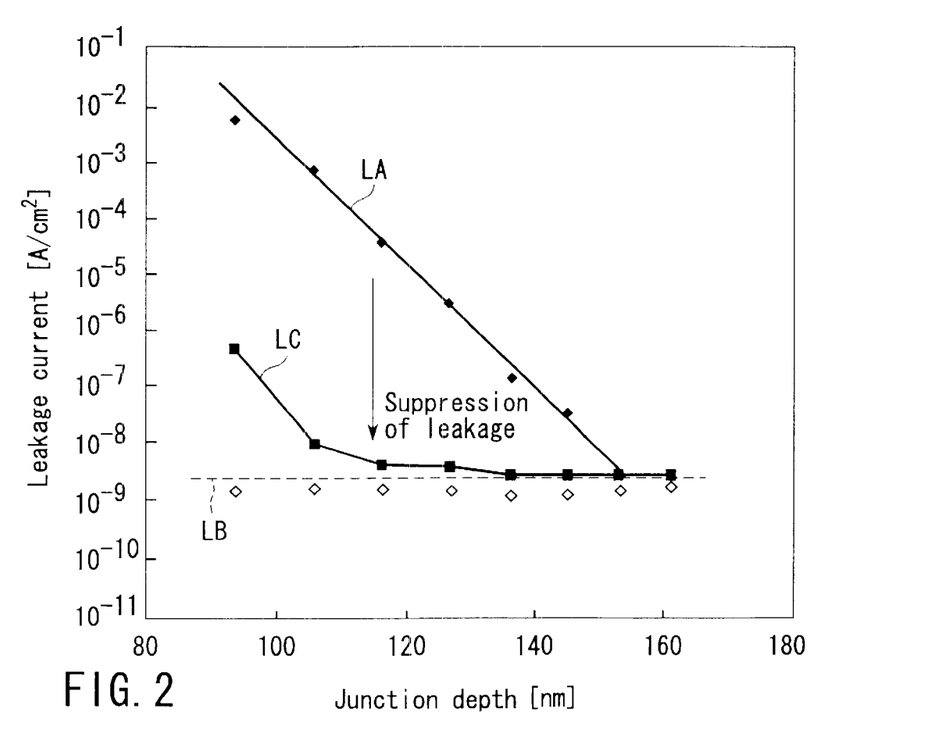
FIG. 2 is a graph showing junction leakage suppression by ion implantation through an oxide film, as a function of junction depth.

FIG. 2 is a graph showing junction leakage suppression by ion implantation through an oxide film, as a function of junction depth. Referring to FIG. 2, a line LC indicates a junction leakage current when As is ion-implanted through an oxide film at $1\times10^{14}$ cm$^{-2}$, and then, a 35-nm CoSi$_2$ film is formed. A line LA indicates a junction leakage current when a 35-nm CoSi$_2$ film is formed without executing ion implantation. A line LB indicates control data when no silicidation is executed. In either case, the reverse bias voltage applied is 4 V. It is apparent from the line LC that the leakage is suppressed by four or more orders of magnitude by As ion implantation through an oxide film. At a junction depth of 120 nm or more (i.e., the distance from the bottom of the silicide layer to the junction bottom is 85 nm or more), the leakage is reduced to almost the leakage level of the control pn junction.

Figure 3:
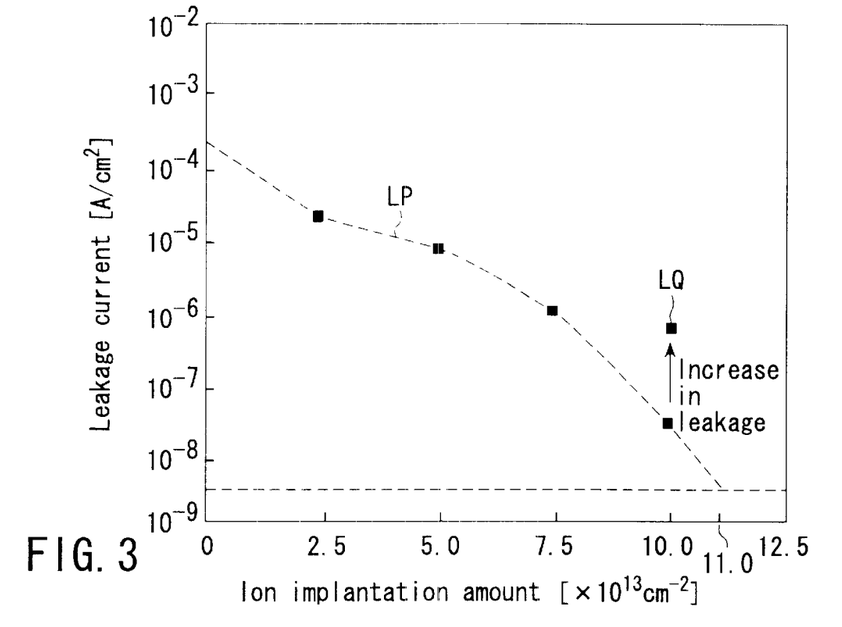
FIG. 3 is a graph showing junction leakage suppression by ion implantation through an oxide film, as a function of ion implantation amount.

FIG. 3 is a graph showing junction leakage suppression by ion implantation through an oxide film, as a function of ion implantation amount. Referring to FIG. 3, a line LP indicates a junction leakage current of a pn junction at a depth of 100 nm when As is ion-implanted through an oxide film, and then, a 35-nm CoSi$_2$ film is formed. It is apparent from the line LP that the leakage current monotonically decreases along with an increase in dose and reaches almost the level of the reference junction at $1.1 \times 10^{14}$ cm$^{-2}$. A point LQ indicates comparison data when As is ion-implanted at $1 \times 10^{14}$ cm$^{-2}$ without any oxide film. In this case, because of lack of "knock-on" oxygen, the leakage current increases by about two orders of magnitude as compared to the case wherein ions are implanted through an oxide film.

Figure 4:
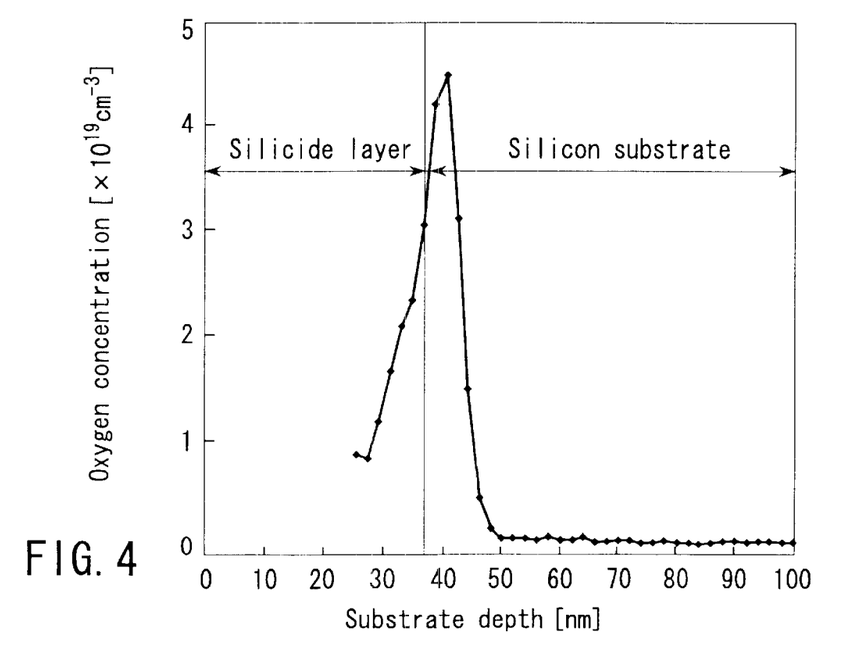
FIG. 4 is a graph showing a SIMS analysis result so as to indicate an oxygen atom distribution in a silicide layer and silicon substrate when ion implantation is executed through an oxide film, and then, a silicide layer is formed.

FIG. 4 is a graph showing a SIMS analysis result so as to indicate an oxygen atom distribution in a silicide layer and silicon substrate when As ions are implanted through an oxide film, and then, a silicide layer is formed. When a silicide is formed, oxygen atoms gather to the interface between the silicide layer and silicon. As is apparent from FIG. 4, oxygen atoms are present on the interface at a peak concentration of $4.5 \times 10^{19}$ cm$^{-3}$ and areal density of $5 \times 10^{13}$ cm$^{-2}$.

An increase in contact resistance due to such oxygen atoms that were locally distributed on the interface was only 1.5 times that when no oxygen is contained. That is, the contact resistance could fall within the range of $1 \times 10^{-6}$ Ωcm$^{-2}$ or less. When the peak concentration and areal density of oxygen at the interface had the above values or more, the leakage current was sufficiently suppressed.

As described above, when ion implantation is executed through an oxide film immediately before silicidation, the leakage current generated by silicidation can be suppressed. As a result, since the junction of the source and drain regions can be kept shallow, the short channel effect is suppressed. For this reason, the length of the source and drain extensions can be shortened. In addition, due to the leakage current reducing effect, a silicide layer can be formed immediately near the source and drain extensions of a MOSFET. Hence, the drivability of the MOSFET improves. Furthermore, by restricting the introduction of the knock-on oxygen to the above identified critical areas (i.e., only near the source/drain region adjacent to the sidewalls) and keeping remaining source/drain regions (where the junction depth is relatively deep and therefore more immune from leakage generation) free from knock-on oxygen, the contact resistance between the silicide layers and source/drain regions can be kept sufficiently low.

Figure 5A:
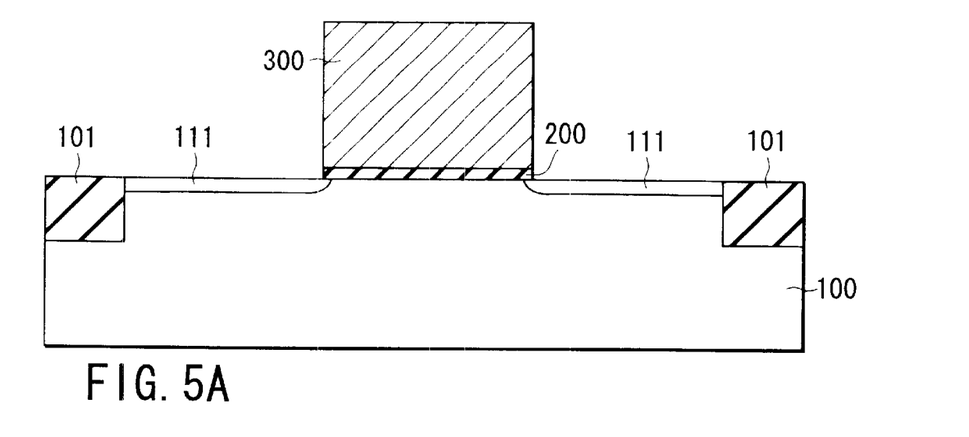
FIGS. 5A to 5C are sectional views showing steps in manufacturing a semiconductor device having a MOSFET structure according to an embodiment of the present invention.
Figure 5B:
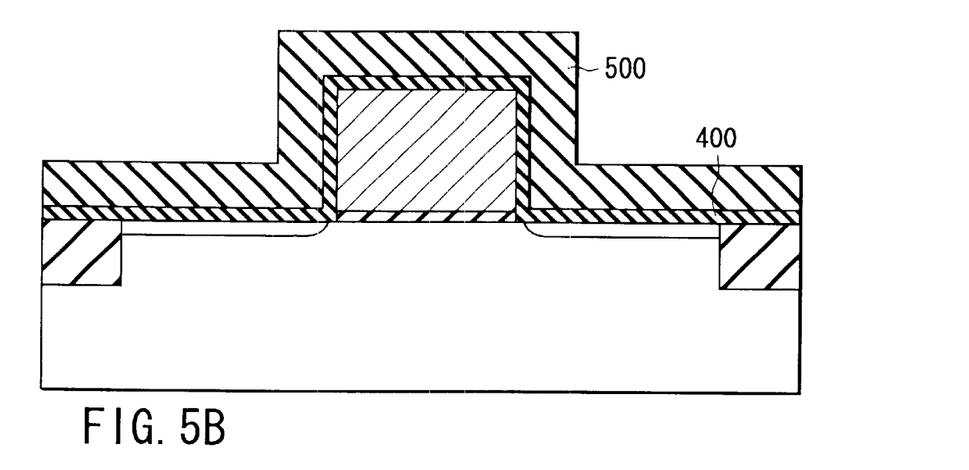
Figure 5C:
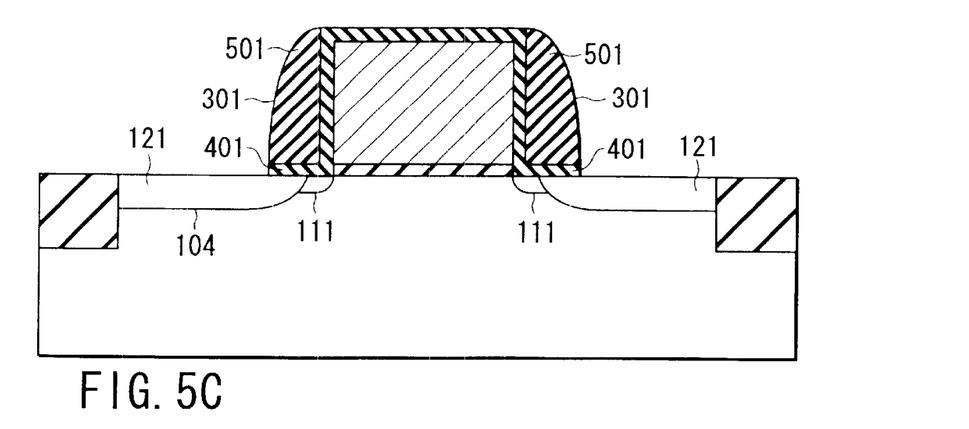

FIGS. 5A to 5C are sectional views showing steps in manufacturing a semiconductor device having a MOSFET structure according to an embodiment of the present invention. This embodiment is related to a method of manufacturing a silicide MOSFET structure while suppressing Co atoms from diffusing into a substrate. The manufacturing method to be described below can be applied to both an N-MOSFET and a P-MOSFET.

First, the structure shown in FIG. 5A is formed by an effective method of a known technique. The structure shown in FIG. 5A has an device-isolation region 101 formed in the surface of a silicon semiconductor substrate 100, a gate insulating film 200, e.g., a silicon oxide film formed on the surface of the substrate 100, and a gate electrode layer 300, i.e., a polysilicon film formed on the surface of the gate insulating film 200. A pair of shallow diffusion layers 111 having a conductivity type opposite to that of the substrate and serving as part of source and drain extensions are formed on the left and right sides of the gate electrode layer 300. The well 102 shown in FIG. 1A is omitted for the illustrative convenience.

Next, as shown in FIG. 5B, a silicon oxide film 400 having a thickness of, e.g., 20 nm is deposited on the entire surface using an effective method of a known technique, e.g., CVD (Chemical Vapor Deposition). An insulting film that can be selectively etched with respect to the silicon oxide film 400, e.g., a silicon nitride film 500 having a thickness of, e.g., 70 nm is deposited on the entire surface.

As shown in FIG. 5C, the entire substrate surface on which the films are formed is etched by anisotropic etching (RIE: Reactive Ion Etching) in the vertical direction using reactive plasma, thereby forming gate sidewall insulating films on the left and right sides of the gate electrode layer 300. At this time, a silicon oxide film 401 and silicon nitride film 501 remain on the side surfaces of the gate electrode layer. The silicon oxide film 401 may be left on the entire surface of the substrate 100 at the left and right portions of the gate electrode layer, where the source and drain regions are to be formed, by manipulating the RIE process.

Using the gate electrode layer 300 and gate sidewall insulating films as a mask, an impurity having a conductivity type opposite to that of the substrate is introduced using an effective method of a known technique, e.g., ion implantation. The impurity is activated by annealing to form deep diffusion layers 121 of the pair of source and drain regions 104 on the left and right sides of the gate electrode layer. At this time, the pn junction formed between the substrate and the diffusion layer 121 is deeper than that formed between the substrate and the shallow diffusion layer 111 serving as part of the source or drain extension. Here, it should be noted that the diffusion layers 121 below the sidewalls are formed by lateral diffusion of the implanted impurity and therefore their junction depth below and near the sidewalls becomes shallower than that of the rest of the source/drain regions.

Figure 6A:
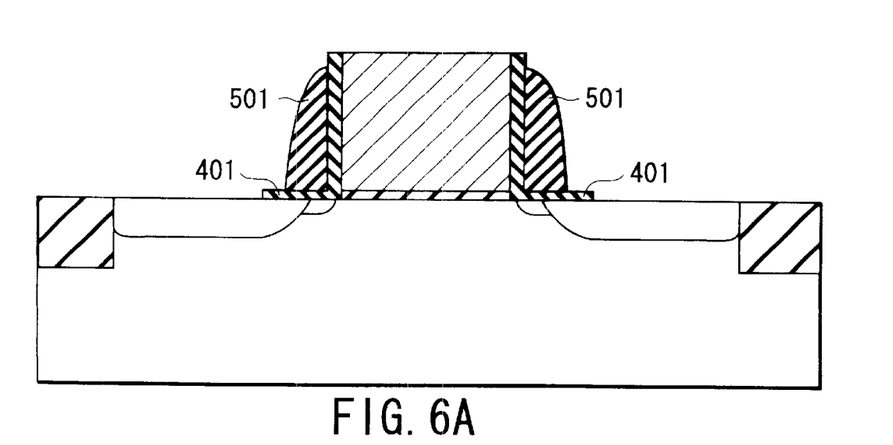
FIGS. 6A to 6C are sectional views showing steps in manufacturing a semiconductor device next to FIG. 5C.

Next, as shown in FIG. 6A, the silicon nitride films 501 that form gate sidewalls are selectively isotropically etched with respect to the silicon oxide films 401 and silicon substrate 100 by an effective method of a known technique, e.g., dipping the structure in a hot phosphoric acid solution such that the exterior surfaces of the silicon nitride films 501 are partially removed and parts of the underlying silicon oxide films are exposed on both sides of the gate electrode. For the isotropic etching, the etching time and the like are adjusted such that the silicon oxide films 401 having a desired length are exposed. In the channel length direction (i.e., horizontal direction in the figure) the exposed portion of each silicon dioxide 401 is set to have a length of 10 nm or more and ½ or less the length of the source/drain regions outside of the sidewalls 501.

Regarding the thickness of the silicon oxide film 401, implantation through an oxide film thinner than 5 nm will reduce knock-on efficiency of Oxygen. On the other hand, implantation through an oxide film thicker than 30 nm will require higher ion bombarding energy, resulting in scattering of the implanted ions and associated defects deeper into the substrate, which are undesirable for realization of shallow junctions. Thus, an oxide film having a thickness between 5 and 30 nm should be used. More preferably, an oxide film with a thickness between 10 and 20 nm is to be used, as exemplified in this embodiment.

Regarding the length the exposed portion of the silicon oxide film 401, the oxide film coverage not more than half of each of the source and drain regions will ensure a less-than 20% increase in contact resistance. On the other hand, exposure of the oxide film 401 shorter than 10 nm will not be effective to block the metal migration, which would have a diffusion length similar to this value. Thus, it is preferable to set the length of each exposed portion of the silicon oxide film 401 to be 10 nm or more and to be not more than ½ the length of each source and drain region from the side insulating wall 301.

Figure 6B:
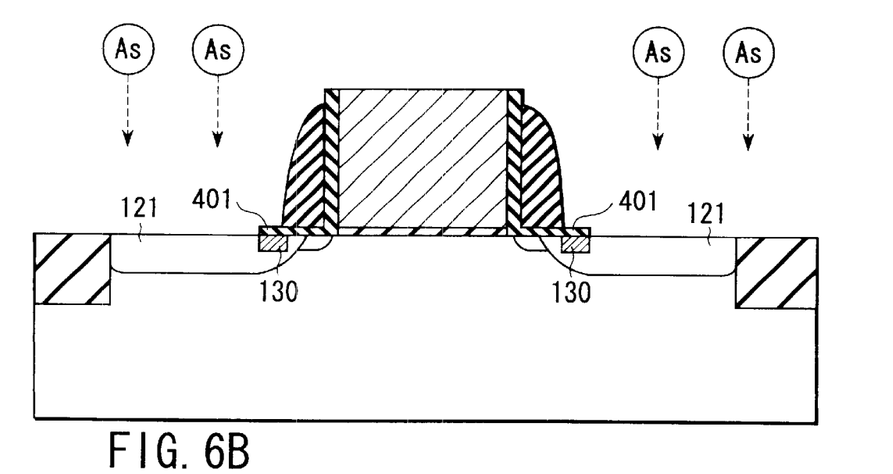

As shown in FIG. 6B, e.g., As is ion-implanted into the silicon substrate 100 at an acceleration voltage of 50 kV and a dose of $1 \times 10^{14}$ cm$^{-2}$. At a portion 130 (a portion corresponding to the oxygen-introduced portion 131) on the lower side of each of the exposed silicon oxide films 401, oxygen atoms in the silicon oxide film 401 are "knocked on" in self-alignment with the end portion of the source or drain extension and introduced simultaneously with the implanted element, i.e., As. Consequently, crystal defects and "knock-on" oxygen simultaneously exist at the portion 130. On the other hand, only As is introduced into the source and drain regions from which the silicon oxide films 401 are removed so that crystal defects are generated in the surface to turn these regions amorphous. At this time, the range of ion-implanted atoms is preferably set to be smaller than the thickness of a silicide layer to be formed after that.

Figure 6C:
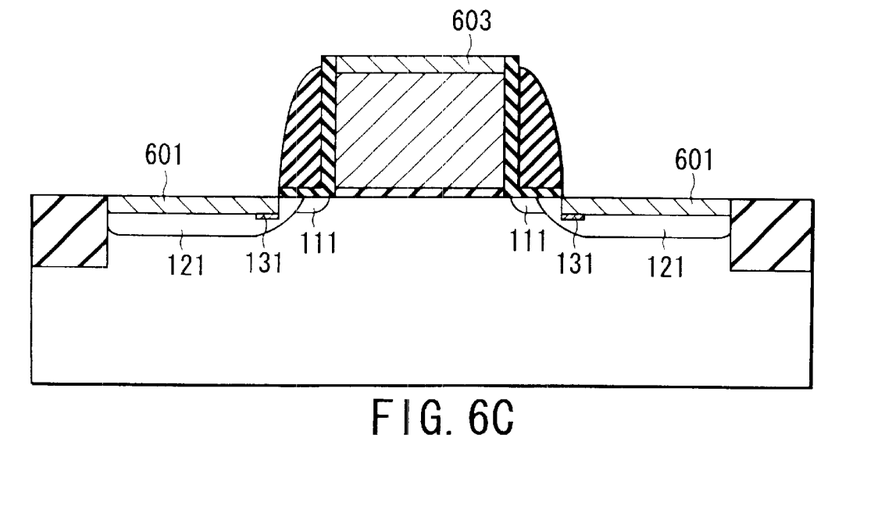

Next, the resultant structure is dipped into, e.g., an HF solution to remove the exposed silicon oxide films 401, i.e., portions that the protruding outside of the silicon nitride films 501 of the gate sidewall portions. Subsequently, a Co film having a thickness of, e.g., 10 nm is deposited on the entire surface by an effective method of a known technique, e.g., sputtering. This substrate is rapidly annealed, e.g., in nitrogen at 500° C. for 30 sec to selectively form silicide layers between Co and silicon that is in direct contact with Co. With this process, silicide layers 601 and 603 are formed on the source and drain regions 104 and gate electrode layer 300. In this case, the final thickness of each silicide layer is about 35 nm. Unreacted Co portions on the device-isolation region and gate sidewalls are selectively removed by dipping the structure into a solution mixture of sulfuric acid and hydrogen peroxide. The structure is further rapidly annealed, e.g., in nitrogen at 800° C. for 30 sec to further reduce the electrical resistance of Co silicide. FIG. 6C shows the sectional structure of the semiconductor device at this time.

Near the source/drain regions adjacent to the sidewalls (where junctions are formed by lateral diffusion and therefore distance from the silicide layers to the junctions is small), both crystal defects and knock-on oxygen are introduced. Thus, as described with the reference to FIGS. 2 to 4, Co in-diffusion into the silicon substrate is efficiently suppressed near those critical regions. For this reason, even when the silicide layer and the pn junction of the source or drain region is close to each other, any leakage current is prevented. As a result, the junction depth of the diffusion layer 121 can be made shallow, and any short channel effect can be suppressed. For this reason, the length of the shallow diffusion layer 111 (i.e., the length of the gate sidewall) serving as the source or drain extension can be decreased.

Since the source and drain extensions have a high electrical resistance, the drivability of the MOSFET can be increased by shortening the source and drain extensions. In addition, when leakage is suppressed, the silicide layers can be formed immediately near the end portions of the short source and drain extensions. Hence, the drivability of the MOSFET is further improved. On the other hand, no "knock-on" oxygen is introduced into portions of the source and drain regions 104 (separated from the source and drain extensions) where the junction depth is relatively deep and a large leakage current is not always generated. For this reason, at these portions, a satisfactory contact resistance is maintained between the source and drain regions 104 and the silicide layers 601.

In this way, a MOSFET which has silicide layers 601 and 603 formed on the source and drain regions 104 and gate electrode layer 300 and also has a very shallow and short source and drain diffusion layers 111 is completed. In this MOSFET, since diffusion of metal atoms is suppressed, the junction leakage is suppressed very low, and high-speed operation is possible with an improved drivability. Subsequently, a process of forming a dielectric interlayer and a contact hole that extends to each electrode layer through the dielectric layer, a wiring process, and a mounting process are executed to complete a final semiconductor device.

As described above, according to this embodiment, when As is ion-implanted through the silicon oxide films 401 immediately before deposition of the Co film to be silicided, the surfaces of the source and drain regions are provided with crystal defects and "knock-on" oxygen, which is generated when the implanted ions have knocked out oxygen in the oxide film. The crystal defects modulate reaction in the subsequent silicidation process and suppress the siliciding metal from diffusing to the silicon substrate. In addition, since both the crystal defects and the "knock-on" oxygen are present, diffusion of the siliciding metal to the silicon substrate is further considerably suppressed. As a result, the leakage current is suppressed by four or more orders of magnitude by As ion implantation through the oxide films 401 and reduced to almost the leakage level of the silicide-less junction (i.e., refiner junctions).

Moreover, in this embodiment, by making use of the partial removal of the nitride films 501 and resultant exposure of oxide films 401 over the areas near the source/drain regions adjacent to the sidewalls, the knock-on oxygen is introduced in a self-aligned manner (i.e., without requiring lithography) into these critical and most vulnerable portions to the leakage generation (it should be noted that the junctions there are formed by lateral diffusion and therefore the distance from the silicide layers to the junctions is the shortest). Furthermore, by restricting the introduction of the knock-on oxygen to the above identified critical areas and keeping remaining source/drain regions (where the junction depth is relatively deep and therefore more immune from leakage generation) free from knock-on oxygen, the contact resistance between the silicide layers and source/drain regions can be kept sufficiently low. Hence, leakage generation by silicidation is effectively prevented in a self-aligned manner without compromising the contact resistance.

Figure 8:
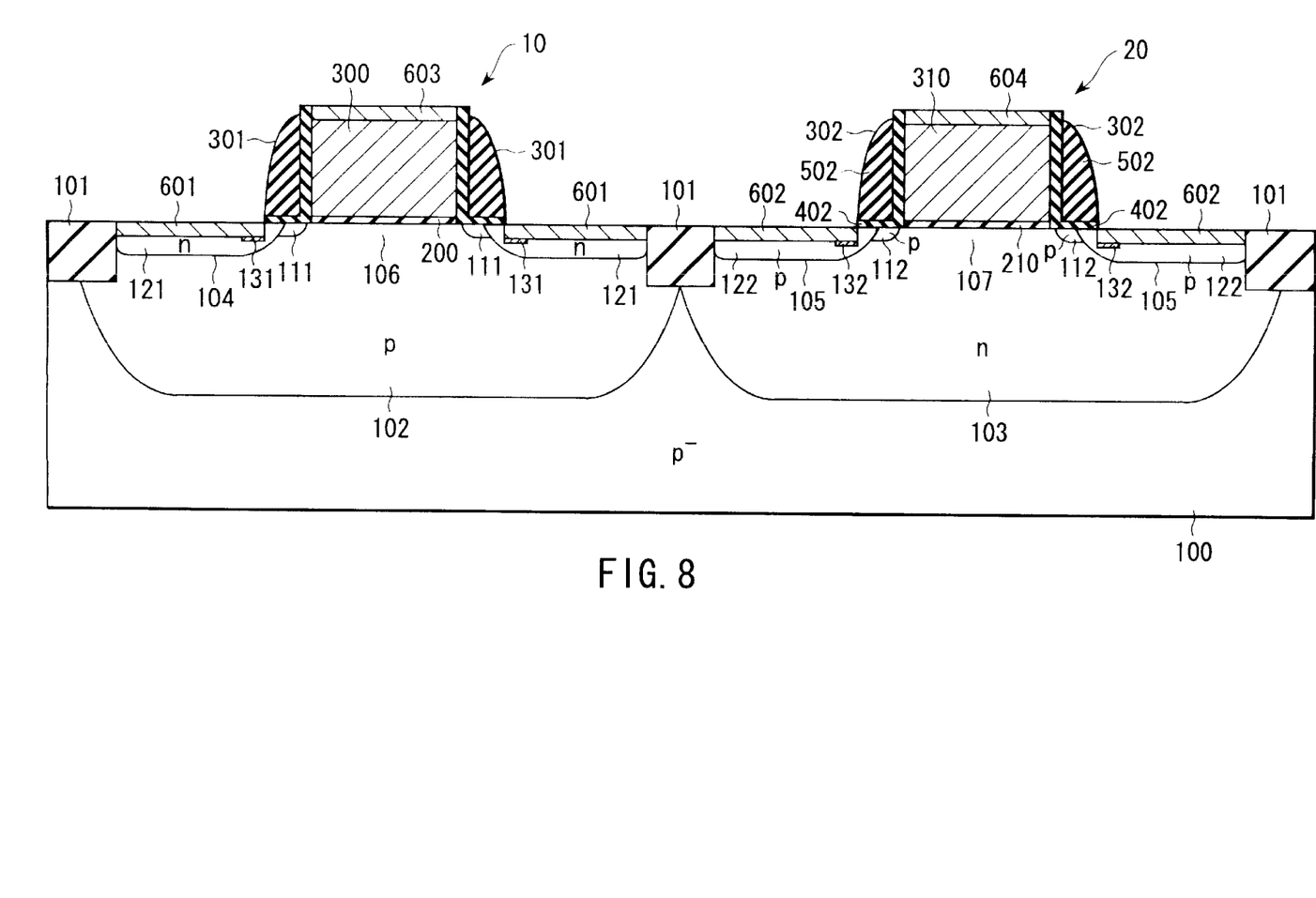
FIG. 8 is a sectional view showing a semiconductor device having a C-MOSFET structure according to another embodiment of the present invention.

FIG. 8 is a sectional view showing a semiconductor device having a C-MOSFET structure according to another embodiment of the present invention. A plurality of device-isolation regions 101 are formed in the surface of a p-type silicon substrate 100 containing a carrier impurity (B) at a concentration of about $1 \times 10^{15}$ cm$^{-3}$. A p-well 102 containing a carrier impurity (B) at a concentration of about $1 \times 10^{18}$ cm$^{-3}$ is formed in the surface of the silicon substrate 100 between two device-isolation regions 101. An n-well 103 containing a carrier impurity (P) at a concentration of about $1 \times 10^{18}$ cm$^{-3}$ is formed in the surface of the silicon substrate 100 between two other device-isolation regions 101.

An N-MOSFET 10 and P-MOSFET 20 are formed in the p-well 102 and n-well 103, respectively. The N-MOSFET 10 is designed on the basis of the same structure and conditions as those of the device described with reference to FIG. 1. Only the P-MOSFET 20 will be described below.

A pair of p-type source and p-type drain regions 105 are separately formed in the n-well 103. Each of the source and drain regions 105 has a carrier impurity (B) surface concentration of $5 \times 10^{20}$ cm$^{-3}$ or more, and formed of a shallow diffusion layer (extension) 112 and a deep diffusion layer 122.

A surface region of the well 103 sandwiched between the source and drain regions 105 in the channel direction is defined as a channel region 107. A polysilicon gate electrode layer 310 is formed on the channel region 107 via a gate insulating film 210. A p-inverted layer that connects the source and drain regions 105 is selectively induced in the surface of the channel region 107 by the gate electrode layer 310.

A pair of sidewall insulating films 302 are formed on the sides of the gate electrode layer 310 respectively facing the source and drain regions 105. Each sidewall insulating film 302 is formed from a silicon oxide film 402 on the silicon substrate 100 and gate electrode layer 310 and a silicon nitride film 502 on the silicon oxide film 402. The silicon oxide film 402 has a thickness of from 5 to 30 nm, and preferably, a thickness of from 10 to 20 nm.

Silicide layers 602 and 604 are formed on the source and drain regions 105 and gate electrode layer 310, respectively. Each of the silicide layers 602 and 604 is made of a $CoSi_2$ layer. The distance from the bottom of the silicide layer 602 to the bottom of the source or drain region is set to be 100 nm or less.

An oxygen-introduced portion 132 is formed near the surface area of each source and drain region immediately outside of the sidewall. In the channel length direction, each oxygen-introduced portion is adjacent to the sidewall and formed to have a length of 10 nm or more and ½ or less the length of the corresponding source or drain region outside of the sidewall. For example, assume that the source or drain region extends 100 nm outside of the sidewall along the channel direction, the oxygen-introduced portion has a length of 50 nm or less, and preferably 35 nm or less in this direction.

In the oxygen-introduced portion 132, oxygen atoms are locally distributed on the interface between the silicide layer 602 and the silicon layer of the source or drain region 105 at a concentration of $4.5 \times 10^{19}$ $cm^{-3}$ or more and an areal density of $5 \times 10^{13}$ $cm^{-2}$ or more. However, the oxygen-introduced portion 132 is not a silicon oxide film. Instead, the oxygen-introduced portion 132 forms an Ohmic contact with the silicide layer 602 and the silicon layer of the source or drain region 105. This Ohmic contact has a contact resistance of $1 \times 10^{-6}$ $\Omega cm^{-2}$ or less. Additionally, the oxygen-introduced portion 132 contains As, which is originally an n-impurity, at a concentration approximately of from $4 \times 10^{19}$ to $4 \times 10^{20}$ $cm^{-3}$, because knock-on oxygen is introduced into the source and drain regions by As implantation through the oxide 402 as exemplified in the previous embodiment.

According to this embodiment, in both of the N-MOSFET 10 and the P-MOSFET 20, even when the silicide layer and the pn junction of the source or drain region are close to each other, any leakage current is prevented. The junction depth of the diffusion layers of the source and drain regions can be made shallow, and the short channel effect can be suppressed. For this reason, the length of the shallow diffusion layer 111 or 112 (i.e., the length of the gate sidewall) serving as the source or drain extension can be decreased. In addition, silicide layers can be formed immediately near the source and drain extensions of the MOSFET by the leakage current reducing effect. As a result, the operation speed and packing density of the C-MOSFET can be increased.

As described above, the present invention can be applied to both an N-MOSFET and a P-MOSFET. The N-MOSFET and P-MOSFET can be manufactured by processes including common steps by appropriately using a mask material.

In addition, the present invention can also be applied to a specific part of the circuit composed of plural of the N-MOSFET's or P-MOSFET's.

In the above-described embodiments, a normal MOSFET has been described. However, these embodiments can also be applied to an elevated source drain structure. In this case, an oxide film is deposited on additionally formed source and drain layers. The oxide film may be further processed by RIE as needed to selectively leave the oxide film on a region (facet portion) that is adjacent to the gate sidewall and has a small film thickness. After that, As is ion-implanted through the oxide film. The oxygen incorporation and the crystal defects formation obviate the source/drain elevation to a height-level comparable to the gate electrode, which would otherwise be required without the As implantation. Since the metal diffusion in the subsequent silicidation process is suppressed substantially and the junction leakage is reduced considerably, minimal source/drain elevation (less than 100 nm) will suffice to have satisfactory device functions.

Furthermore, the leakage current can be effectively suppressed even by executing ion implantation through an oxide film on the entire surface of the source and drain regions. Also it should be mentioned here that, by making use of oblique implantation, the oxygen can be knocked-on into the outer peripheries of the junction regions from surrounding oxide layers comprising the device-isolation regions while keeping the vertical range of the implantation short. With this arrangement, leakage can be considerably suppressed not only near the gate sidewall but also at the interface with respect to the device-isolation region.

The metal film formed on the source and drain regions is not limited to Co. Ni or any other metal can be used. In addition, ions to be implanted are not limited to As. Ge or Xe may also be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a pair of source and drain regions each formed in a surface portion of a silicon layer, and spaced from each other through a channel region in a surface portion of a silicon layer in a channel length direction;
    a gate electrode layer formed on the channel region via an insulating film;
    a pair of sidewall insulating films formed on sides of the gate electrode layer respectively facing the source and drain regions;
    a pair of silicide layers respectively formed on the source and drain regions, and extending from the sidewall insulating films toward outer ends of the source and drain regions; and
    a pair of oxygen-introduced portions respectively formed in the source and drain regions, and extending under the silicide layers from the sidewall insulating films toward the outer ends of the source and drain regions, the oxygen-introduced portions containing oxygen atoms that are locally distributed on interfaces between the silicide layers and the silicon layers of the source or drain regions at a concentration of not less than 4.5×

$10^{19}$ cm$^{-3}$ and an areal density of not less than $5\times10^{13}$ cm$^{-2}$ and, and the oxygen-introduced portions forming an Ohmic contact between the silicide layers and the silicon layers of the source or drain regions.

2. A device according to claim 1, wherein the Ohmic contact has a contact resistance of not more than $1\times10^{-6}$ $\Omega$cm$^{-2}$.

3. A device according to claim 1, wherein each of the oxygen-introduced portions has a length of not less than 10 nm and not more than ½ a length from a corresponding one of the sidewall insulating films to an outer end of a corresponding one of the source and drain regions in the channel length direction.

4. A device according to claim 1, wherein the source and drain regions have n-conductivity type, and the oxygen-introduced portions contain As at a concentration higher than a remaining portion of the source and drain regions.

5. A device according to claim 1, wherein the source and drain regions have p-conductivity type, and the oxygen-introduced portions contain As at a concentration of from $4\times10^{19}$ to $4\times10^{20}$ cm$^{-3}$.

6. A device according to claim 1, wherein each of the sidewall insulating films comprises an oxide film formed on a corresponding one of the source or drain regions, and an insulating layer formed on the oxide film.

7. A device according to claim 6, wherein the oxide film comprises a silicon oxide film having a thickness of from 5 to 30 nm.

8. A device according to claim 6, wherein the insulating layer comprises a silicon nitride film.

9. A device according to claim 1, wherein a distance from a bottom of the silicide layers to a bottom of the source or drain regions is not more than 100 nm.

10. A device according to claim 1, wherein the silicide layer comprises a CoSi$_2$ layer.

11. A method of manufacturing the semiconductor device of claim 1, comprising:

forming the source and drain regions, using impurity ion implantation and annealing;

implanting predetermined ions to positions of the source and drain regions, which correspond to the oxygen-introduced portions, through an oxide film so as to introduce oxygen atoms in the oxide film into the source and drain regions;

depositing a metal film on the source and drain regions; and forming the silicide layer by siliciding the metal film, using annealing.

12. A method according to claim 11, wherein the predetermined ions are implanted to positions other than the positions of the source and drain regions, which correspond to the oxygen-introduced portions, to turn the surface of the source and drain regions amorphous.

13. A method according to claim 11, wherein each of the oxygen-introduced portions has a length of not less than 10 nm and not more than ½ a length from a corresponding one of the sidewall insulating films to an outer end of a corresponding one of the source and drain regions in the channel length direction.

14. A method according to claim 11, wherein the oxide film comprises a silicon oxide film having a thickness of from 5 to 30 nm.

15. A method according to claim 11, wherein the predetermined ions consisting essentially of As.

16. A method according to claim 15, wherein a dose of As implantation is set to be not less than $1.1\times10^{14}$ cm$^{-2}$.

17. A method according to claim 11, further comprising removing the oxide film before the metal film is deposited.

18. A method according to claim 11, wherein the oxide film is part of a silicon oxide film forming a bottom portion of the sidewall insulating films.

19. A method according to claim 11, wherein a range of ions in implanting the predetermined ions is set to be smaller than a thickness of a silicon layer consumed in a subsequent silicidation reaction.

20. A method according to claim 11, wherein the metal film is substantially formed from Co.

\* \* \* \* \*